United States Patent [19]
Urner-Willie et al.

[11] 4,438,508
[45] Mar. 20, 1984

[54] MAGNETO-OPTICAL MEMORY ELEMENT

[75] Inventors: Marlies Urner-Willie, Hamburg; Peter Hansen, Appen, both of Fed. Rep. of Germany

[73] Assignee: U.S. Philips Corporation, New York, N.Y.

[21] Appl. No.: 268,027

[22] Filed: May 27, 1981

Related U.S. Application Data

[63] Continuation-in-part of Ser. No. 132,747, Mar. 24, 1980.

[30] Foreign Application Priority Data

Mar. 27, 1979 [DE] Fed. Rep. of Germany ....... 2911992

[51] Int. Cl.³ .............................................. G11C 13/06
[52] U.S. Cl. .................................. 365/122; 252/62.55; 350/376; 427/132; 428/692; 428/900
[58] Field of Search ............... 365/122, 34; 252/62.55; 427/132; 428/692, 900; 350/376, 377, 378

[56] References Cited

U.S. PATENT DOCUMENTS

| | | | |
|---|---|---|---|
| 3,342,591 | 9/1967 | Gambino et al. | 75/152 |
| 3,427,134 | 2/1969 | Holtzberg et al. | 23/204 |
| 3,680,065 | 7/1972 | Almasi et al. | 350/377 |
| 3,801,966 | 4/1974 | Terao | 430/57 |
| 3,871,745 | 3/1975 | Waku et al. | 365/112 |
| 3,947,089 | 3/1976 | Rapp | 350/378 |
| 4,018,692 | 4/1977 | Akselrod et al. | 252/62.57 |
| 4,032,216 | 6/1977 | Henry | 350/378 |
| 4,126,494 | 11/1978 | Imamura et al. | 148/31.57 |
| 4,131,462 | 12/1978 | Lee et al. | 96/1.5 R |
| 4,170,689 | 10/1974 | Katsui et al. | 428/457 |
| 4,199,396 | 4/1980 | Brandle et al. | 156/617 SP |

FOREIGN PATENT DOCUMENTS 49-89897 8/1974 Japan .

Primary Examiner—William R. Dixon, Jr.
Attorney, Agent, or Firm—Marc D. Schechter

[57] ABSTRACT

A magneto-optical memory element consisting of a substrate, provided with an amorphous layer of an alloy of a rare-earth metal and a transition metal. The layer has a uniaxial magnetic anisotropy. Such memory elements are suitable for storing digital information in the form of magnetized areas, the magnetization direction of which can be read by means of the Kerr effect or Faraday effect. By adding bismuth and/or tin to the alloy the Kerr rotation and Faraday rotation can each be increased considerably, so that simpler reading of the stored information is possible.

8 Claims, 8 Drawing Figures

MAGNETO-OPTICAL MEMORY ELEMENT

This application is a continuation-in-part of Ser. No. 132,747, filed Mar. 24, 1980.

BACKGROUND OF THE INVENTION

The invention relates to a magneto-optical memory element comprising a nonmagnetizable substrate having a layer of an amorphous material thereon. The amorphous material has a uniaxial magnetic anisotropy and it is an alloy of a rare-earth metal and a transition metal.

Such memory elements are known from U.S. Pat. No. 3,949,387 (same as German Auslegeschrift No. 23 40 475). The amorphous layer, in this patent, consists of a binary or a ternary composition the components of which belong to the 3d, 4f and 5f series elements of the periodic table.

Alloys of rare-earth metals and transition metals, when manufactured under certain conditions, are characterized by an amorphous structure, ferrimagnetic properties and, in the case of a layered construction, a uniaxial magnetic anisotropy which is perpendicular to the surfaces of the layer.

When a magneto-optical memory element having such an amorphous layer is locally heated to a temperature which is near either the compensation temperature or the Curie temperature of the material of the layer, for example by means of a focused laser beam, the heated area of the layer can be magnetized in a desired direction perpendicular to the surface of the layer by applying an external magnetic field extending perpendicular to the surface of the layer. After cooling the heated area of the layer, the coercive field strength must be sufficient to stabilize the magnetically varied area of the layer (the domain). The size of a stabilized area of the layer may be a few micrometers in diameter. An information value which corresponds to a logic "1" or "0" is assigned to such an area of the layer according to the direction of the magnetization in the interior of the area. Depending on the temperature up to which the layer is heated, the above-described process is referred to as compensation point switching or Curie point switching, respectively.

By means of a linearly polarized light beam, the magnetization direction of the area of the layer, and hence the information content thereof, can be determined as a result of the magneto-optical Faraday effect or Kerr effect. The magneto-optical rotation (Kerr rotation and Faraday rotation) of the known layers, however, is not too large. For example, the Faraday rotation of GdFe, at room temperature measured with light of a wavelength of 633 nm, is $1.7 \times 10^5$ degrees per centimeter (°/cm.).

SUMMARY OF THE INVENTION

It is an object of the invention to provide a magneto-optical memory of the type described above having increased Faraday or Kerr rotations as compared with known memory elements of the rare-earth metal/transition metal type. Such materials provide imporved reading of the information stored in such a memory element.

According to the invention this object is achieved in that the alloy comprises at least 1 atomic % of bismuth and/or tin.

It has been found that by the addition of bismuth and/or tin to amorphous alloys of rare-earth metal and transition metals, an increase in the Kerr rotation by approximately 40% and in the Faraday rotation by approximately 60% can be achieved. The rotation increases when the bismuth and/or tin content increases, however the rate of increase becomes substantially zero after the alloy comprises 25 atomic % or more of bismuth and/or tin.

Layers having the desired perpendicular magnetic anisotropy are obtained when the layers have a composition which is defined by the formula $(R_{1-x}M_x)_{1-y}A_y$, wherein R is at least one representative of the group of rare-earth metals, M is at least one representative of the group of transition metals, A is at least one of the group of bismuth and, tin, and $0.6 \leq x \leq 0.9$.

According to a further advantageous embodiment of the invention the rare-earth metal used is at least gadolinium (Gd) and the transition metal used is iron (Fe) because, an amorphous layer manufactured from such materials for a magneto-optical memory element rotates the plane of oscillation of a linearly polarized light beam over large angles with only small quantities of bismuth and/or tin added. The ratio of gadolinium to iron (in atomic %) lies, in particular, in the range of from 26:74 to 27:73, and the bismuth and/or tin content is between 1 and 13 atomic %.

In addition to the advantageous aspect of increasing the magneto-optical rotation, it has been found that the addition of bismuth and/or tin also has a disadvantageous aspect. The bismuth and/or tin content considerably influences the compensation temperature and also influences the Curie temperature, although the latter to a much smaller extent. This means that if one does not succeed in making the composition of the layers very homogeneous, the compensation temperature will differ from place to place in the layer. As a result, the layer becomes useless for writing information by means of compensation point switching. In sufficiently homogeneous layers it is possible, for example, that the compensation temperature proves to differ from, for example, $-50°$ C. to $+90°$ C.

The invention also relates to a method of manufacturing a memory element having an amorphous layer as described above and in which the composition of the amorphous layer is extremely homogeneous. For that purpose the method according to the invention is characterized in that the materials, making up the amorphous layer of the memory element are provided on a nonmagnetizable substrate placed on a substrate holder. The substrate holder rotates at a constant speed per unit of time.

In this manner it may be ensured that the amorphous layer of the memory element has a homogeneous composition and consequently has the same magnetic and magneto-optical properties in all areas thereof. Notably, the compensation temperature of layers manufactured according to the present invention varied by at most 5° C. in a given case.

The invention also relates to a magneto-optical memory device of the type having a memory plate and an optical write/read unit. The read/write unit comprises a source of radiation, for emitting a linearly polarizable light beam which is positioned arbitrarily relative to the memory plate, a detector, for measuring the rotation of the plane of oscillation of the light beam transmitted by the memory plate or reflected by the memory plate, respectively, and a magnetic coil, for generating a magnetic field extending perpendicular to the memory plate. The device ist characterized in that the memory plate is a memory element having an amorphous layer of a bismuth and/or tin-containing alloy of a rare-earth metal and a transition metal, as described above. An advantageous embodiment of the device according to the invention is characterized in that the amorphous layer of the memory element is provided on the free side of a transparent flat electrode which forms part of an assembly of two transparent flat electrodes between which a photoconductor layer is present. This has the advantage that the storage (writing) of information in the memory element can take place by means of a low-intensity light beam. The extra energy necessary for varying the magnetization state present in the memory element is obtained by supplying Joule heat which is generated in the area of the photoconductors situated between electrodes which is irradiated by the light beam.

Embodiments of the invention will now be described in greater detail with reference to the drawing.

DESCRIPTION OF THE PREFERRED EMBODIMENTS

Figure 1:
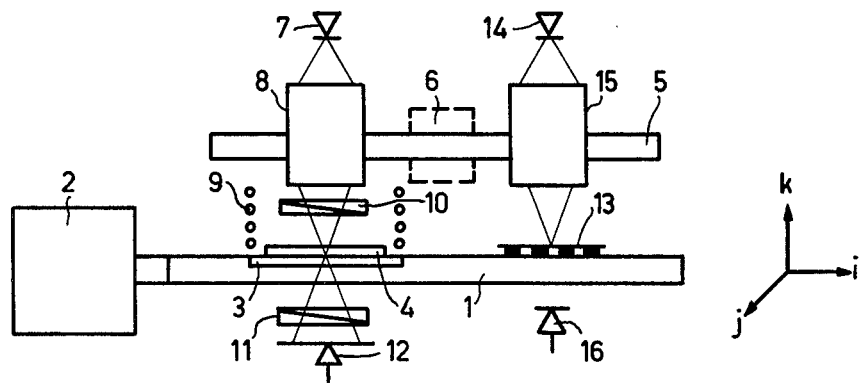
FIG. 1, shows schematically, a magneto-optical memory device having a magneto-optical element.

FIG. 1 shows schematically a magneto-optical memory device. A transparent supporting plate 1 is arranged so as to be movable by means of suitable bearings in the i-direction of a system of coordinates ijk. Via a driving mechanism 2, for example a loudspeaker coil, the supporting plate 1 can be positioned in the i-direction. A substrate 3, having a magneto-optical memory layer 4, is provided on the supporting plate 1 so as to be fixed or exchangeable.

The optical components necessary for writing (storing) and reading, respectively, are present on a second supporting plate 5 which can be moved perpendicular to the i-direction in the j-direction and can be positioned by means of a driving mechanism 6 (for example, also a loudspeaker coil). A corresponding basic unit of the write/read system consists, for example, of a laser diode 7, the radiation of which is focussed on the layer 4 by display optics 8, so that a previously selected memory site is heated for writing information.

By applying an external magnetic field extending in the k direction (perpendiular to the surface of the layer 4) by means of a magnet coil 9, the magnetization in the previously selected area of the layer 4 can be set to the direction associated with the information value to be written.

For reading by means of the Faraday effect, the light ist linearly polarized by a polarizer 10 before entering the layer 4. The light intensity behind an analyser 11, which is nearly crossed with respect to the polarizer 10, depends on the rotation of the polarization plane (plane of oscillation) of the linearly polarized light, which in turn depends on the information stored in the layer 4. The light for generating a read signal is detected by means of a photodiode 12.

The information in the layer 4 can also be read by means of the Kerr effect. Since the radiation reflected by the surface of the memory layer is measured in this case, an optical construction is necessary which differs from the one shown in FIG. 1.

By correctly positioning the two supporting plates 1 and 5 relative to each other, the write/read unit can be moved to be directly above any desired point on the memory layer 4, whereupon it can write or read information there. Beside the layer 4, the supporting plate 1 is provided with two strip frames 13 extending in the i-direction and i-direction, respectively, (perpendicular relative to each other). The periods of frames 13 correspond to the distance between the memory sites on the memory layer. These strip frames 13 are scanned by light from a light source 14, for example a laser diode, which passes through display optics 15. From the number of brightness changes produced due to the relative movement between the strip frame 13 und the light source 14, the paths covered in the i-direction and the j-direction, and thus the correct position are measured. The brightness changes are detected by photodiode 16. For reading or for writing the information in this position, from a previously given adjusted position, a control signal is obtained from the difference between adjusted and real value, which signal drives the driving mechanisms 2 and 6 in such manner that the desired position is reached again.

Figure 2:
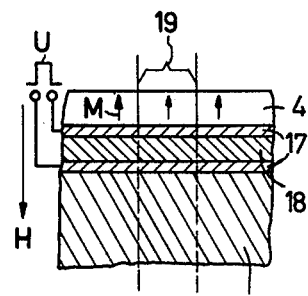
FIG. 2 shows, partly in cross-section, a magneto-optical memory element having a photoconductor situated between two electrodes.

FIG. 2 shows an embodiment in which the memory layer 4 is provided on a photoconductor layer 18 which is present between two transparent flat electrodes 17. The electrodes 17 and photoconductor 18 are present directly on the substrate 3 which, for example, may be of glass. For writing information on a memory site of the magneto-optical memory layer 4, the photoconductor 18 is exposed to a light ray through the uppermost transparent electrode 17, for example, a ray 19 of a He-Ne laser. When a voltage pulse U is applied to the transparent electrodes 17, a current flows trough the exposed zone of the photoconductor 18. The generated Joule heat is transferred by heat conduction to the overlying memory cell so that a reversal of the magnetization M within the memory cell is possible with only a small intensity light beam 19 and with the use of an external magnetic field H. The memory cell is the area of the magneto-optical memory layer 4 irradiated by the light beam 19.

The magneto-optical memory layer 4 can also be operated without a photoconductor. The required intensity of the light beam 19, in this case the power of the laser, however, would then have to be increased.

Examples of amorphous layers of magneto-optical memory elements according to the invention include amorphous ferrimagnetic $(Gd_{1-x}Fe_x)_{1-y}Bi_y$ layers which are manufactured in a high vacuum vapor deposition device at a pressure of $6 \times 10^{-8}$ to $1 \times 10^{-7}$ Torr.

The individual components of Gd, Fe and Bi were evaporated simultaneously from three separate, water-cooled copper crucibles by means of electron beams. The copper crucibles are situated in the corners of an equilateral triangle, while the distance between the copper crucibles and the substrate was approximately 56 cm. Gd and Fe were deposited for all compositions with a fixed vapor deposition rate of 0.5 nm/s of Gd and 0.6 nm/s of Fe, while the vapor deposition rate of the Bi for the manufacture of GdFeBi layers with different Bi contents was increased in steps of 0.05 nm/s from 0.1 nm/s to 0.4 nm/s. Substrates 3 were made of glass supports which themselves have a negligible influence on the magnetic and magneto-optical properties, respectively, of the memory layer.

The memory layers manufactured under these circumstances had the following composition:

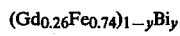

$(Gd_{0.26}Fe_{0.74})_{1-y}Bi_y$ where y varies from 0.02 to 0.13. The formed memory layers had an average thickness between 100 to 200 nm. By means of X-ray diffraction experiments their amorphous structure could be demonstrated.

Figure 4A:
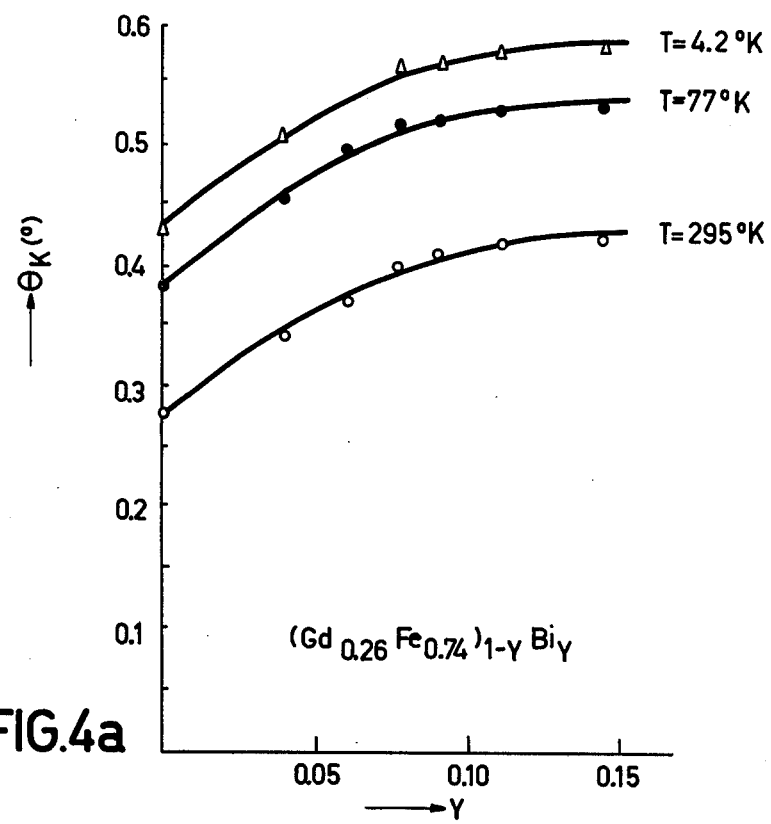
FIG. 4a is a graph of the Kerr rotation, $O_k$, (in degrees) of $(Gd, Fe)_{1-y}Bi_y$ films as a function of the Bi content.
Figure 4B:
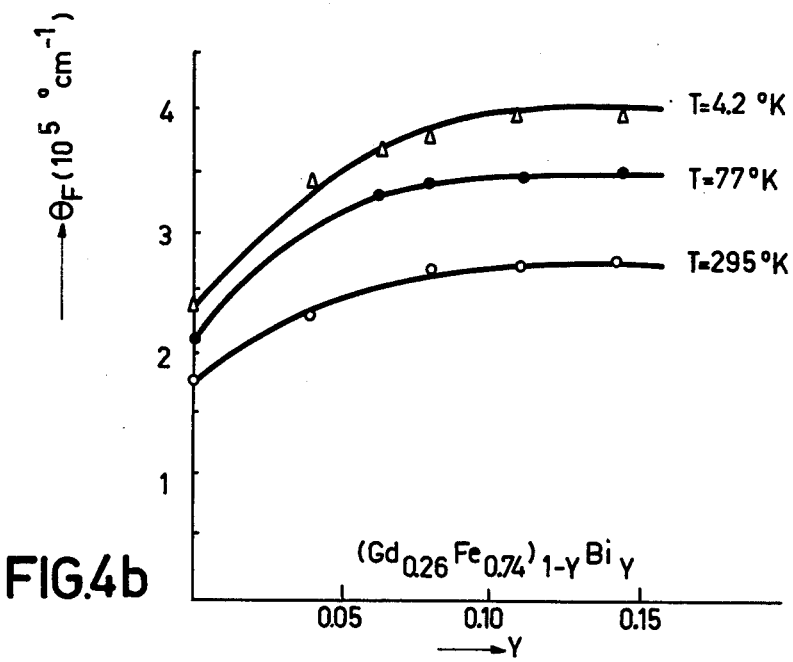
FIG. 4b is a graph of the Faraday rotation, $O_F$, (in $10^5$ degrees/cm) of $(Gd, Fe)_{1-y}Bi_y$ films as a function of the Bi content.

Compared with the known values of the Kerr effect and the Faraday effect of bismuth-free amorphous GdFe memory layers, the above-mentioned layers have approximately 50% larger Kerr rotations $\theta_k$ (FIG. 4a) and Faraday rotations $\theta_F$ (FIG. 4b), respectively.

Figure 3:
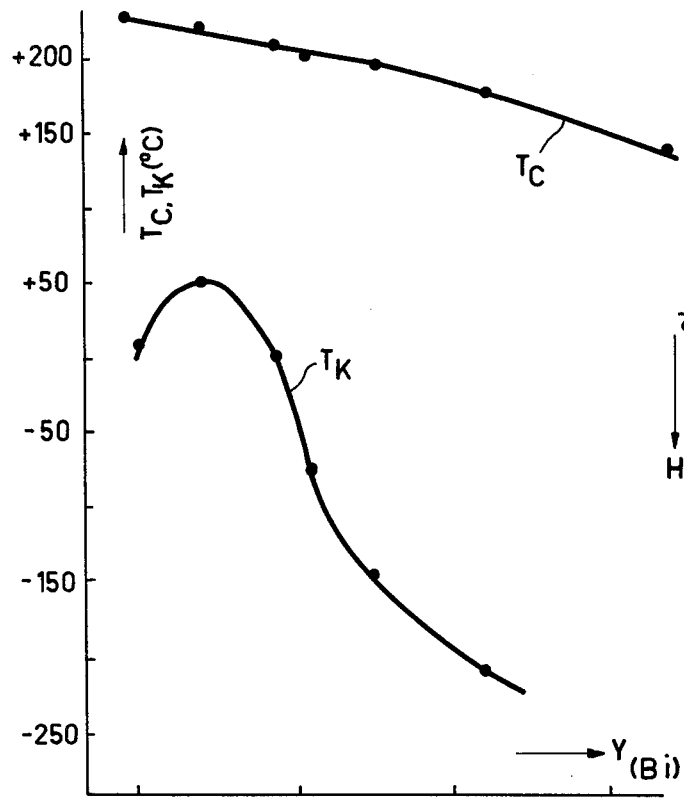
FIG. 3 is a graph of the Curie temperature, $T_c$, and the compensation temperature, $T_k$, as a function of the bismuth content, y, of a $(Gd,Fe)_{1-y}Bi_y$ memory layer.

The Curie temperature $T_c$ and the compensation temperature $T_k$ as a function of the bismuth content y are recorded in FIG. 3 for the various memory layers 4 with the above compositions. It may be seen that the compensation temperature $T_k$ which plays an important role in thermomagnetic writing (storing), can be varied over a large range (from $+50°$ C. to $-220°$ C.) by varying the bismuth content y. The Curie temperature $T_c$ is influenced much less.

The conditions for thermomagnetic writing (for example, laser power, strength of external magnetic field) are determined by the compensation temperature $T_k$. Therefore, the compensation temperature $T_k$ must not vary more than a few degrees over the surface of the memory layer. In the disclosed embodiment, the surface of the memory layer measures 35×25 cm, so that the memory layer 4 must be very homogeneous.

By rotating the substrate dish during the vapor deposition process, the layer produced will have a very homogeneous thereof and magnetic and magneto-optical properties.

A layer of $(Gd_{0.26}Fe_{0.74})_{1-y}Bi_y$ where y=0.02 was manufactured while the substrate dish was rotated at a speed of 550 rpm. The compensation temperature proved to differ very little from 22° C. at various measuring points at the center of the layer and at the edges. The layer was very homogeneous in composition. The result could be confirmed by measurements of the Faraday effect.

The thermomagnetic writing of information in the memory layer given can take place, for example, by means of a laser having a wavelength of $\lambda=514$ nm and a magnetic field H of approximately 40 Oersted applied externally to the memory layer 4, and by means of compensation point switching.

In compensation point switching the temperature dependence of the coercive field strength Hc is used. In compensation point switching the memory layer is kept near the compensation temperature. The addressed memory site is heated (by the laser), while the field H required for switching decreases by approximately $(T-T_k)^{-1}$ so that only the magnetization of the heated area is directed by the external switching field H.

In the amorphous $(Gd_{1-x}Fe_x)_{1-y}Bi_y$ layers of the above composition, the compensation temperatures $T_k$ are between $-220°$ C. to $+50°$ C. (FIG. 3). Areas havinga diameter of 5–10 micrometers can be written with energies of 0.1–0.3 erg with external magnetic fields of 0–40 Oe. The written pattern is stable but can be erased either by applying a higher external magnetic field (H≧40 Oe) against the direction of the field during writing or by switching again in the opposite direction.

The size of the area and the switching time are dependent both on the external magnetic field H and on the laser capacity. With the given energies the characteristic switching times are between 0.5 and 2 microseconds.

Thermomagnetic writing can also be carried out by means of Curie point switching.

The Curie point switching preferably takes place at the Curie temperature $T_c$ in the range from 80°–100° C.

When the memory layers 4 are combined with a photoconductor 18, the writing sensitivity can be considerably increased. With such a combination the photoconductor 18 is used as a "substrate" for the memory layer (in contrast with the otherwise used glass/memory layer combination). The roughness of the photoconductor and that of the electrode surface 17, respectively (roughness a few μm) results in a stronger adhesion of the magnetic walls in the memory layer, which means an increase of the coercive field strength Hc. Dependent on the roughness of the substratum used, the field strength may increase approximately by a factor 2 to 5, while the compensation temperature $T_k$ remains unvaried. Consequently, no information can be written in rough layers with the energies which are sufficient for writing information in smooth layers with the same compensation temperature, $T_k$. By means of a correct composition change (change of the Bi share) compensation temperature, $T_c$, can be reduced (see FIG. 3) until the temperature dependence of the coercive field strength $H_c$ again shows the same variation as upon providing the memory layer on a smooth surface (glass).

Reading the information is carried out by means of polarized light, for example, laser light having a wavelength of 633 nm. The photoconductor 18 and the electrodes 17, respectively, are chosen to be transparent to light having this wavelength. In addition to reading by reflection, the reading process may be carried out by transmission, provided in the latter case the magneto-optical memory layer 4 is sufficiently thin (d≦60 nm).

Other examples of amorphous layers for magneto-optical memory elements according to the invention form amorphous ferrimagnetic $(Gd_{1-x}Fe_x)_{1-y}Sn_y$ layers which are manufactured at a pressure of $6.10^{-8}$ to $1.10^7$ Torr in the same way as the ferrimagnetic bismuth layers and with the same apparatus. Gd and Fe were deposited for all compositions with a fixed vapor deposition rate of 0.5 nm/s of Gd and 0.6 nm/s of Fe, while the vapor deposition rate of tin (Sn) for the manufacture of the GdFeSn layers with different Sn contents was increased in steps of 0.05 nm/s from 0.1 nm/s to 0.4 nm/s.

The amorphous tin (Sn) layers manufactured in these circumstances prepared anto rotating glass substrates had the following composition:

$(Gd_{0.26}Fe_{0.74})_{1-y}Sn_y$ where y varies from 0.02 to 0.20. The formed GdFeSn-memory layers had an average thickness between 100 and 200 nm. By means of X-ray deflection experiments their amorphous structure could be demonstrated.

Figure 5:
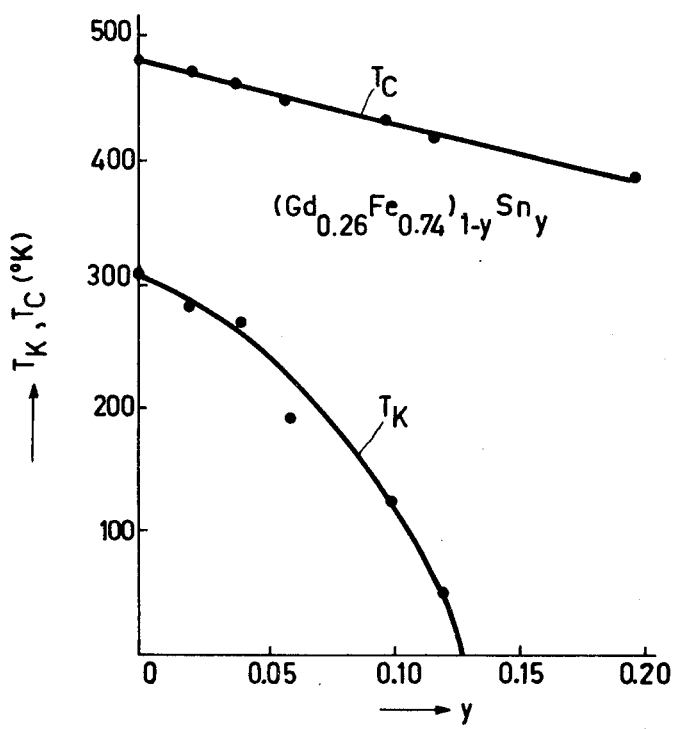
FIG. 5 is a graph of the Curie temperature, $T_c$, and the compensation temperature, $T_k$, as a function of the tin (Sn) content, y, of a $(Gd, Fe)_{1-y}Sn_y$ memory layer.

The Curie temperature $T_c$ and the compensation temperature $T_k$ as a function of the Sn (tin) content y are recorded in FIG. 5 for the various memory layers. The compensation temperature $T_k$ can be varied over a large range (from nearly +40° C. to nearly −220° C.) by varying the Sn content y. The Curie temperature $T_c$ is much less influenced.

Figure 6A:
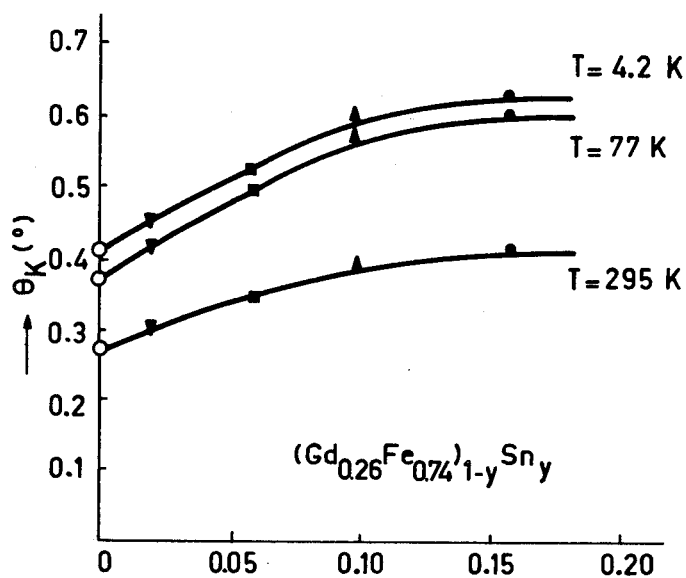
FIG. 6a is a graph of the Kerr rotation, $O_k$, (in degrees of $(Gd, Fe)_{1-y}Sn_y$ film as a function of the Sn content.
Figure 6B:
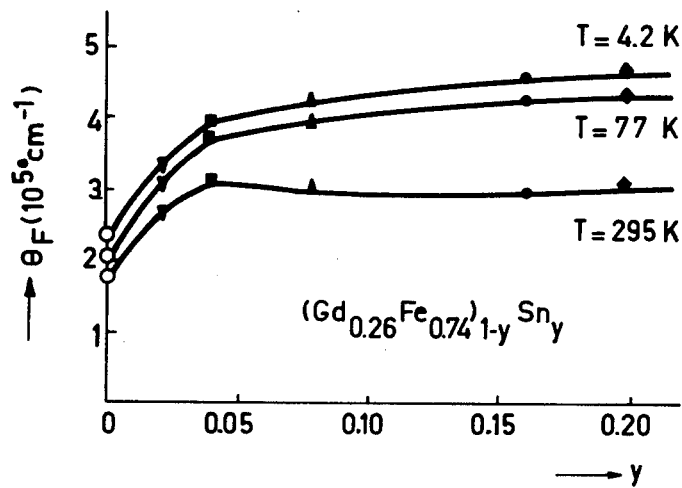
FIG. 6 is a graph of the Faraday rotation, $O_F$, (in $10^5$ degrees/cm) of $(Gd, Fe)_{1-y}Sn_y$ films as a function of the Sn content.

FIG. 6a and FIG. 6b shows the Kerr rotation $\theta_k$ (degrees) and the Faraday rotation $\theta_F(10^5$ degrees/cm) of $(Gd_{0.26}Fe_{0.74})_{1-y}Sn_y$ films as a function of the Sn content y. Compared with the Kerr effect and the Faraday effect of the GdFeBi-alloys, the Kerr rotation $\theta_k$ (FIG. 6a) and the Faraday rotation $\theta_F$ (FIG. 6b) of the GdFeSn-memory layers have nearly the same behavior, respectively. But especially in the range of $0.01 \leq y \leq 0.05$ the Kerr and Faraday rotation of the GdFeSn-alloys is larger than the Kerr and Faraday rotation of the GdFeBi-memory layers.

What is claimed is:

1. A magneto-optical memory element comprising: a nonmagnetizable substrate; and
    an amorphous layer provided on the substrate, said layer comprising an alloy of a rare-earth metal and a transition metal, said alloy having a uniaxial magnetic anisotropy;
    Characterized in that the alloy comprises at least one atomic percent tin.

2. A magneto-optical memory element as claimed in claim 1, characterized in that the alloy has a composition defined by the formula $$(R_{1-x}M_x)_{1-y}Sn_y$$

wherein R is at least one rare-earth metal, M is at least one transition metal, and $0.6 \leq x \leq 0.9$ and $0.01 \leq y \leq 0.25$.

3. A magneto-optical memory element, as claimed in claim 2, characterized in that R is a gadolinium and M is iron.

4. A magneto-optical memory element, as claimed in claim 3, characterized in that $0.73 \leq x \leq 0.74$ and $y \leq 0.13$.

5. A magneto-optical memory element comprising:
    a nonmagnetizable substrate; and
    an amorphous layer provided on the substrate, said layer comprising an alloy of a rare-earth metal and a transition metal, said alloy having a uniaxial magnetic anisotropy;
    characterized in that the alloy further comprises tin.

6. A magneto-optical memory device comprising:
    a memory plate; and
    means for optically reading and writing information on the memory plate, said information being in the form of memory cells which are magnetized in one of two opposite directions normal to the memory plate;
    characterized in that the memory plate is a memory element as claimed in claim 1, 2, 3, 4, or 5.

7. A magneto-optical memory element, as claimed in claim 1, 2, 3, 4, or 5, characterized in that the substrate comprises a photoconductor layer sandwiched between two transparent flat electrodes, and the amorphous layer is provided on one electrode.

8. A magneto-optical memory element, as claimed in claim 1, 2, 3, or 4, characterized in that the alloy further comprises bismuth.

* * * * *